(12) United States Patent
Tomar et al.

(10) Patent No.: US 10,837,106 B2
(45) Date of Patent: Nov. 17, 2020

(54) CLAMPING ASSEMBLY FOR A REACTOR SYSTEM

(71) Applicant: SunEdison, Inc., Maryland Heights, MO (US)

(72) Inventors: Vivek Tomar, Houston, TX (US); Lee William Ferry, St. Charles, MO (US); Puneet Gupta, Newton (SG); Satish Bhusarapu, Sugar Land, TX (US); Richard G. Schrenker, Chesterfield, MO (US)

(73) Assignee: CORNER STAR LIMITED, Hong Kong (HK)

( * ) Notice: Subject to any disclaimer, the term of this patent is extended or adjusted under 35 U.S.C. 154(b) by 135 days.

(21) Appl. No.: 14/709,856

(22) Filed: May 12, 2015

(65) Prior Publication Data

US 2016/0333474 A1 Nov. 17, 2016

(51) Int. Cl.
*C23C 16/44* (2006.01)
*B01J 3/04* (2006.01)
*B01J 3/03* (2006.01)
*C23C 16/24* (2006.01)
*C23C 16/442* (2006.01)

(52) U.S. Cl.
CPC ............. *C23C 16/4409* (2013.01); *B01J 3/03* (2013.01); *B01J 3/042* (2013.01); *C23C 16/24* (2013.01); *C23C 16/442* (2013.01)

(58) Field of Classification Search
CPC ... C23C 16/4409; C23C 16/24; C23C 16/442; C23C 16/4404; B01J 3/03; B01J 3/042; H01J 37/32477; H01J 37/32513
See application file for complete search history.

(56) References Cited

U.S. PATENT DOCUMENTS

| | | | | |
|---|---|---|---|---|
| 3,138,483 | A | * 6/1964 | Dettling | B05D 7/22 118/408 |
| 4,957,572 | A | * 9/1990 | Dewitte | B05C 11/10 118/302 |
| 5,013,015 | A | * 5/1991 | Fatheree | B25B 5/062 269/24 |
| 5,088,444 | A | * 2/1992 | Ohmine | H01L 21/67748 118/715 |
| 5,092,963 | A | 3/1992 | Barker et al. | |
| 7,972,562 | B2 | 7/2011 | Kim et al. | |
| 2009/0217871 | A1 | * 9/2009 | Kim | C23C 16/44 118/663 |
| 2010/0055316 | A1 | * 3/2010 | Honma | C23C 16/45551 427/255.28 |

(Continued)

FOREIGN PATENT DOCUMENTS

| | | |
|---|---|---|
| GB | 2078901 | 1/1982 |
| GB | 2304799 | 3/1997 |

OTHER PUBLICATIONS

Naresh K. Rohatgi, Silicon Production in a Fluidized Bed Reactor: Final Report, Jet Propulsion Lab., dated Apr. 1986, pp. 82.

*Primary Examiner* — Benjamin Kendall
(74) *Attorney, Agent, or Firm* — Armstrong Teasdale LLP

(57) ABSTRACT

Clamping assemblies for sealing an annular chamber and reaction chamber of a reactor system are disclosed. The clamping assemblies may include actuators that are symmetrically arranged in two or more independently controllable groups of actuators.

33 Claims, 10 Drawing Sheets

(56) References Cited

U.S. PATENT DOCUMENTS

2011/0054661 A1* 3/2011 Rasnick ............ H01J 37/32642
                                                                   700/110
2012/0100059 A1   4/2012  Bhusarapu et al.
2012/0164323 A1   6/2012  Bhusarapu et al.
2013/0084233 A1   4/2013  Bhusarapu et al.
2013/0084234 A1   4/2013  Bhusarapu et al.

* cited by examiner

CLAMPING ASSEMBLY FOR A REACTOR SYSTEM

FIELD OF THE DISCLOSURE

The field of the disclosure relates to clamping assemblies and, in particular, clamping assemblies for sealing an annular chamber and reaction chamber of a reactor system.

BACKGROUND

Polycrystalline silicon may be produced economically and at relatively large scale by pyrolysis of thermally decomposable silicon-containing compounds (e.g., silane, trichlorosilane or dichlorosilane) in a fluidized bed reactor. Such polycrystalline silicon may be used for production of solar cells or may be further processed according to the so-called Czochralski method to produce electronic grade single crystal silicon.

Recent advances in production of polycrystalline silicon involve use of relatively high reactor pressures (e.g., 2 bar or more). Such pressures create a large hydrostatic force within the reactor and increase the closing force required to seal the reactor. Further, the fluidized bed reactor may operate with variable pressures which may cause the required closing force of the reactor to vary.

A need exists for clamping assemblies for reactor systems that allow for more precise control of the applied force and that can accommodate changes in the reactor pressure.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a reactor system for producing a reaction product. The system includes a reactor liner defining a reaction chamber therein for receiving reaction components. An outer shell is around the reactor liner with an annular chamber formed between the reactor liner and outer shell. The system includes a seal plate for sealing the annular chamber and the reaction chamber and a plurality of actuators for clamping the seal plate and the outer shell to seal the annular chamber from the reaction chamber.

Another aspect of the present disclosure is directed to a reactor system for producing a reaction product. The system includes a reactor liner defining a reaction chamber therein for receiving reaction components. An outer shell is around the reactor liner with an annular chamber formed between the reactor liner and the outer shell. The system includes a seal plate for sealing the annular chamber and the reaction chamber and an actuator for clamping the seal plate to seal the annular chamber from the reaction chamber. The system also includes a sensor for measuring the force applied by the actuator.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
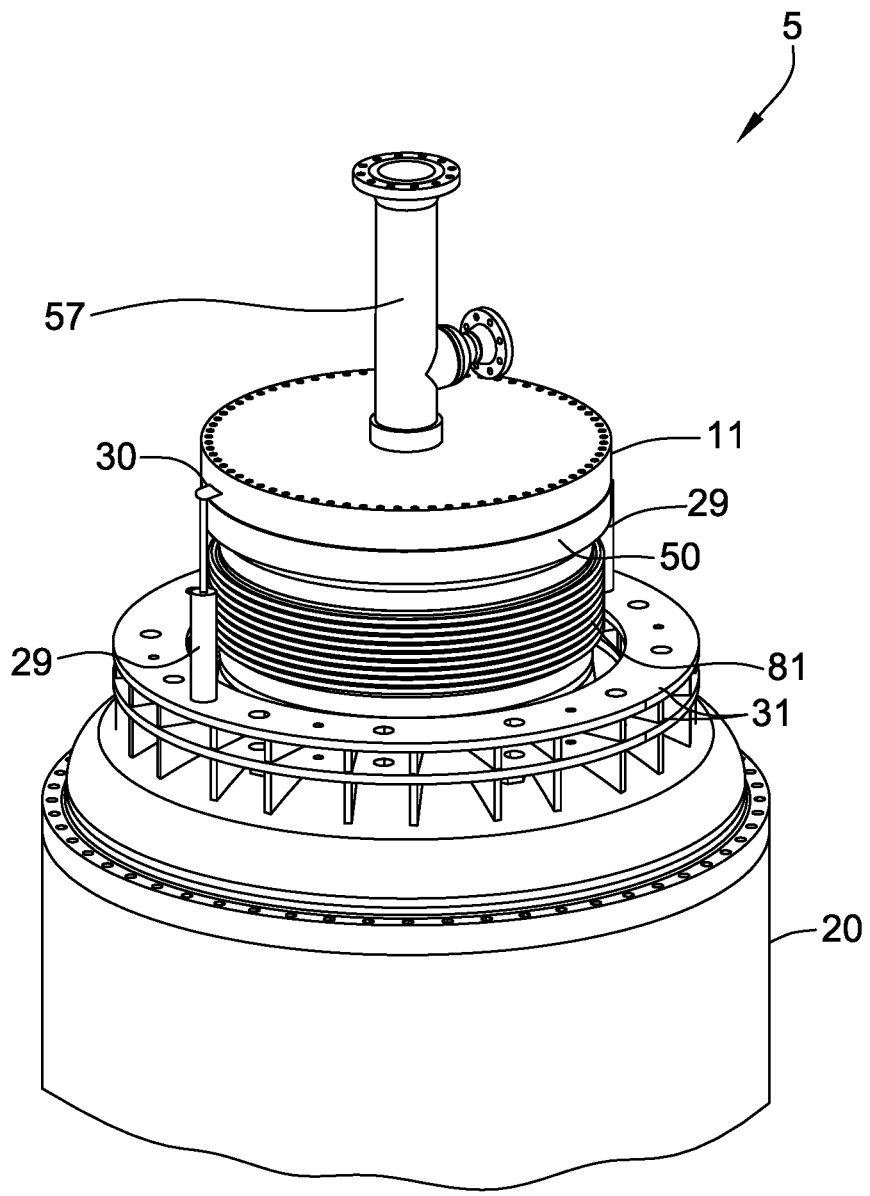
FIG. 1 is a perspective view of a reactor system having a clamping assembly.

An embodiment of a reactor system for producing a reaction product is generally referred to as "5" in FIG. 1. The reactor system 5 includes a reactor liner 17 (FIG. 2) that defines a reaction chamber 15 therein for receiving reaction components. The liner 17 may include a number of separate sections joined by gaskets to seal the various sections. An outer shell 20 surrounds the reaction liner 17 and an annular chamber 12 is formed between the reaction liner 17 and the outer shell 20. A seal plate 11 or reactor "head" seals the reaction chamber 15 and the annular chamber 12 to separate the fluids in each chamber.

Figure 2:
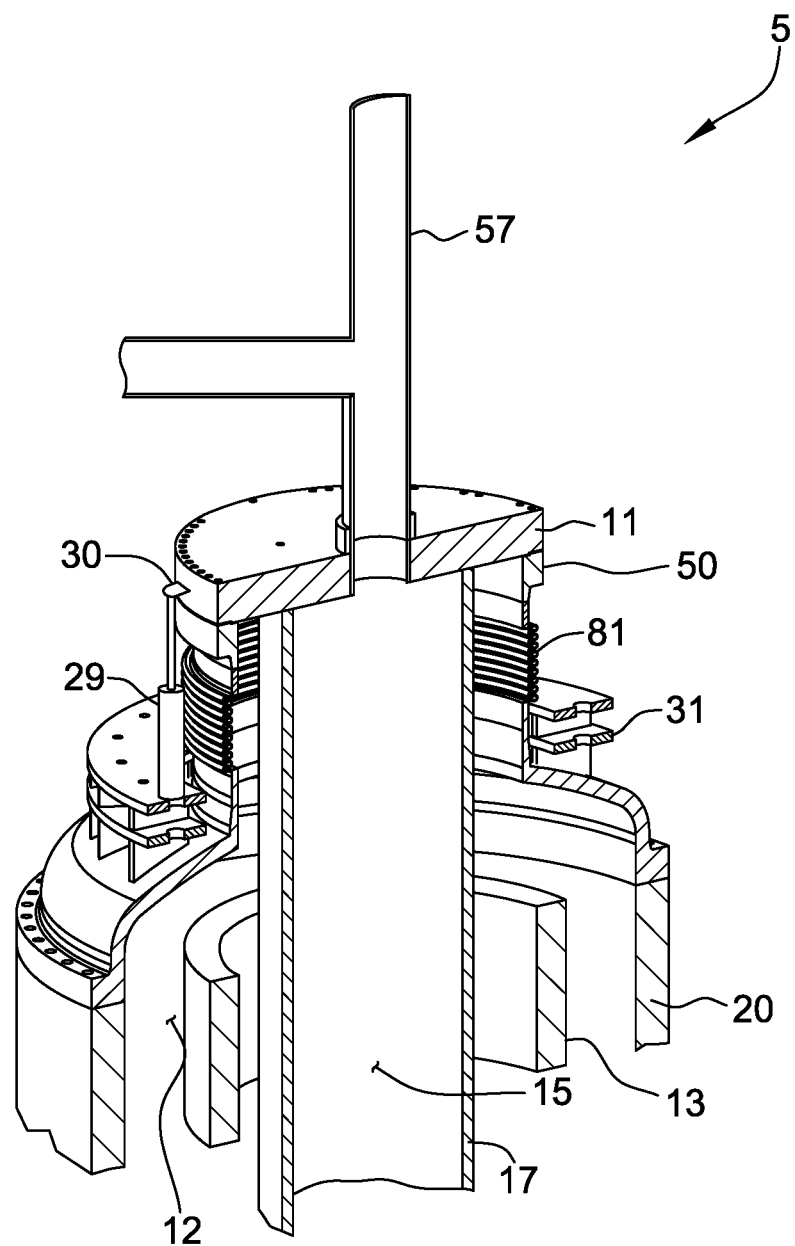
FIG. 2 is a perspective cross-section view of the reactor system.

A clamping assembly includes a number of actuators 29 (FIG. 1) that secure the seal plate 11 by applying a clamping force between the seal plate 11 and the liner 17 and the outer shell 20 to seal the annular chamber 12 from the reaction chamber 15. The clamping assembly generally resists the hydraulic end force from the reaction chamber 15 and/or annular chamber 12. In the illustrated embodiment, the actuators 29 are hydraulic cylinders, though other actuators may be used. The cylinders 29 are attached to the seal plate 11 and to the outer shell 20 to seal the annular chamber 12 and the reaction chamber 15. As shown in FIGS. 1 and 2, the cylinders 29 are attached to flare-out tabs 30 of the seal plate 11. The cylinders 29 may also be mounted to the top of the seal plate 11 (FIGS. 3-7). The cylinders 29 may be attached to a clamping ring 31 (FIGS. 1-2) or a clevis 65 (FIG. 4) that extend from the outer shell 20.

The reactor system 5 may include a pressure balancer (not shown) to counteract changes in the pressure of the reaction chamber 15 and/or the pressure of the annular chamber 12. A gasket 10 may be disposed between the seal plate 11 and a flange 50 that extends from the outer shell 20.

The reactor system 5 includes an outer shell expansion joint 81 to allow for differential expansion of at least one of the reaction liner 17 and the outer shell 20. The expansion joint 81 has a flexible construction to allow for its expansion and contraction. As shown in the Figures, the expansion joint 81 is a bellows. Suitable bellows include formed bellows and edge welded bellows. The expansion joint 81 may include other constructions such as a rubber or PTFE expansion joint or braided metal.

In the illustrated embodiment, the actuator 29 is a powered cylinder such as a hydraulic cylinder. A pump 42 (FIG. 3) feeds hydraulic fluid to the hydraulic cylinders 29 to power the cylinders. A control valve 59 associated with one or more hydraulic cylinders 29 meters flow of hydraulic fluid to the cylinders 29 to control the force applied by the cylinders 29.

Figure 4:
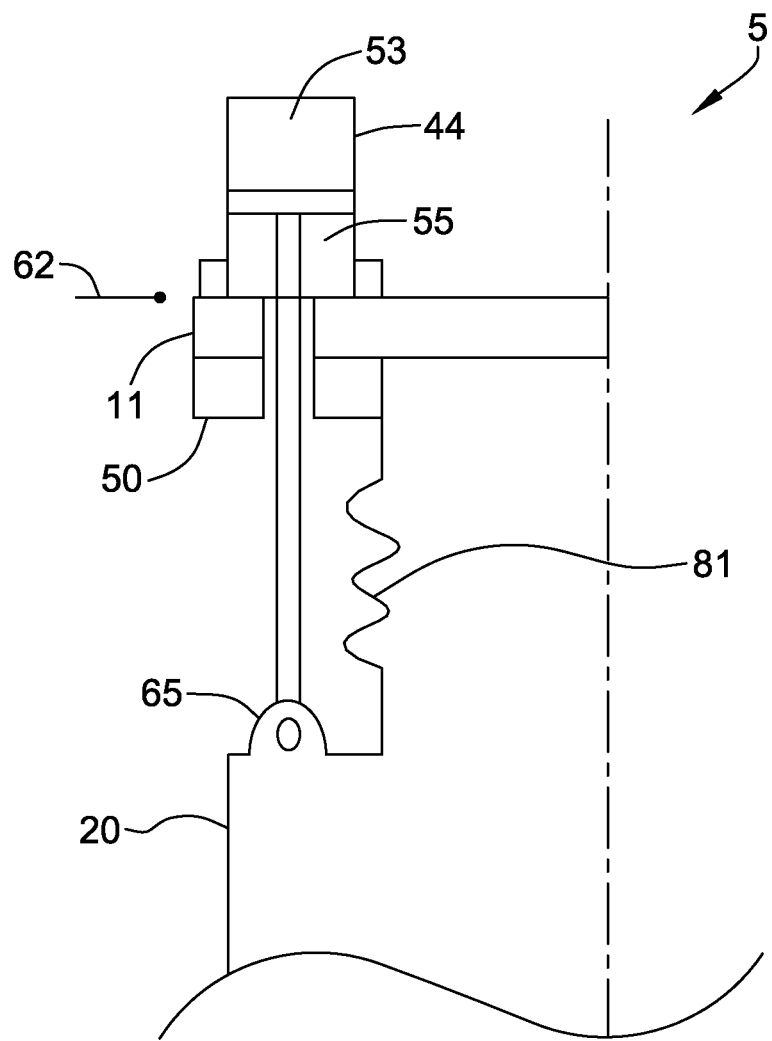
FIG. 4 is a partially schematic view of the hydraulic cylinder of the clamping assembly of FIG. 3.

Each hydraulic cylinder 29 includes a housing 44 that defines at least one cylinder chamber therein and a rod (i.e., piston) 47 that extends from the housing. The rod 47 extends and retracts in response to the flow of hydraulic fluid into and out of the chamber. Generally, the cylinder 29 may be a one way cylinder which is powered to either extend or retract. As shown in FIG. 4, the cylinder 29 may include two chambers 53, 55, one of which is pressurized and the other of which is at a lower pressure (e.g., ambient) during use. The choice of which chamber 53, 55 is at the higher pressure is determined, for example, by whether powered extension or powered retraction of the cylinder is desired.

The reactor system 5 includes sensors 25 (FIG. 3) for measuring the force applied by each actuator 29. As illustrated, the sensor 25 is a load cell. In other embodiments, the sensor is a pressure sensor that measures the pressure of the hydraulic fluid in the cylinder 29 to determine the force applied by the cylinder 29. The sensor 25 may be integrated into the body of the actuator 29 (i.e., form part of the actuator 29) or may be separate from the actuator.

The actuators 29 attached to the clamping ring 31 and the seal plate 11 are generally arranged to provide a symmetric clamping force (e.g., are equally spaced around the circumferences of the clamping ring 31 and seal plate 11). Generally, the apparatus includes at least 3 actuators (e.g., 4, 5, 6, 7, 8 or more actuators) spaced around the circumferences of the clamping ring 31 and the seal plate 11.

The reactor system 5 also includes a first pressure sensor 33 for sensing the pressure in the reaction chamber 15 and a second pressure sensor 37 for sensing the pressure in the annular chamber 12. The pressure sensors 33, 37 relay a signal related to the pressure in the chambers 12, 15 to a controller 40 for adjusting the force applied by the actuators 29. The system 5 may include multiple first pressure sensors 33 or multiple second pressure sensors 37. Use of multiple sensors 33, 37 provides redundancy to prevent system failure upon pressure sensor malfunction. The sensor 25 provides feedback to the controller 40 relating to the amount of clamping force applied to the seal plate 11.

The system 5 also includes a positioning sensor 62 (FIG. 4) for sensing movement of the system resulting from thermal expansion or contraction. In some instances, the positioning sensor 62 senses changes in position of the seal plate 11. As the seal plate 11 moves up during heating, the expansion joint 81 becomes extended and exerts a downward force on the seal plate 11. The positioning sensor 62 measure the movement of the seal plate 11 to determine the closing force of the system 5 as explained further below.

Figure 8:
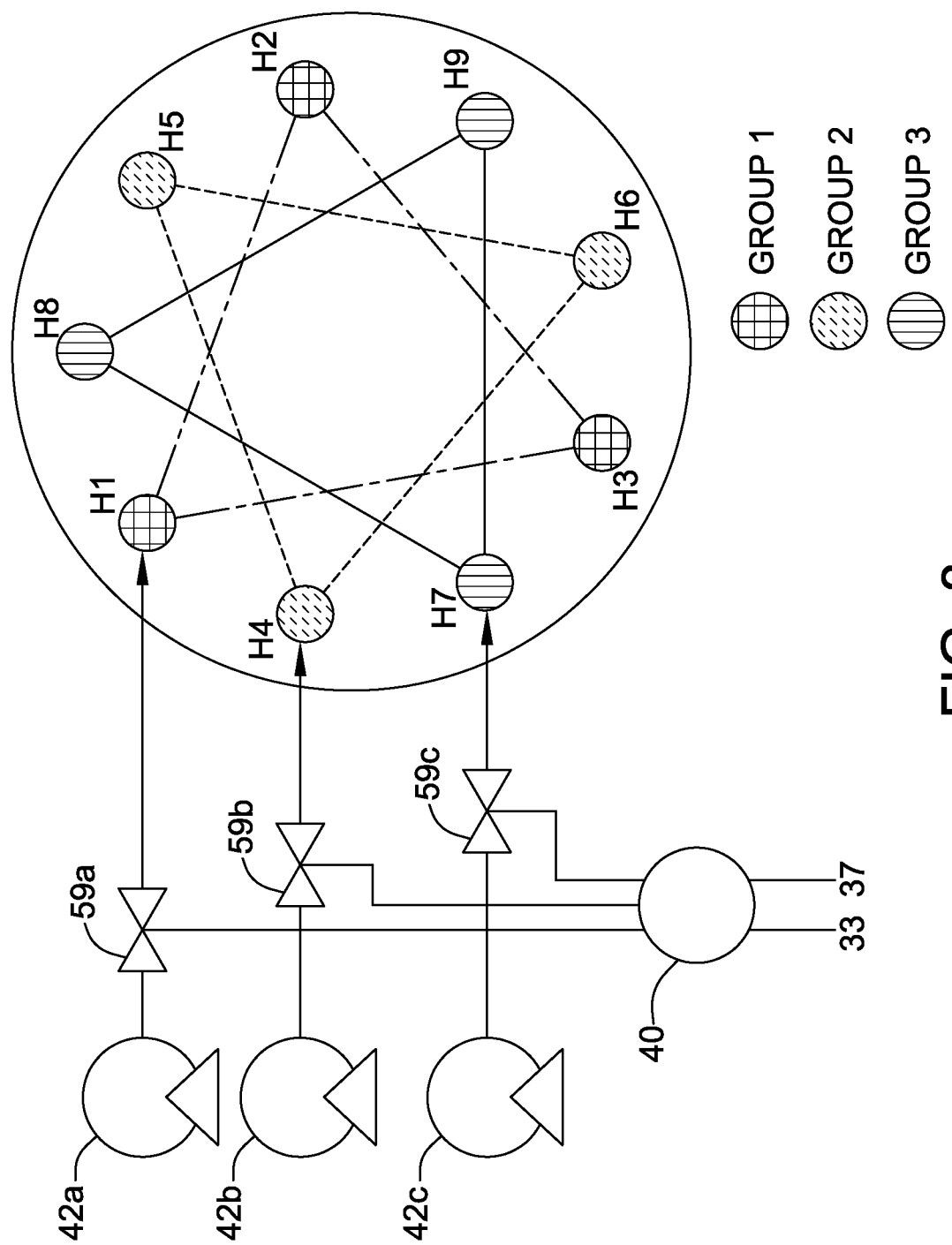
FIG. 8 is a schematic of a nine cylinder clamping system having three groups of cylinders independently controlled.

The controller 40 sends signals to the valve 59 for adjustment of the clamping force applied by one or more actuators 29 in response to changes in the pressure in the reaction chamber 15 and the pressure in the annular chamber 12 and the force detected by sensor 25. As shown in FIG. 8, the reactor system 5 includes nine cylinders H1-H9 that are symmetrically divided into three groups. A valve $59a$, $59b$, $59c$ and a pump $42a$, $42b$, $42c$ are fluidly connected to the cylinders within a group for independent control of each group. Additional valves 59 and pumps 42 may be used within each group of cylinders for redundancy. Independent control of each group of actuators allows for symmetric application of force collectively and within each group, even upon failure of a group of actuators. In instances in which a cylinder malfunctions, the controller 40 may cause the actuators 29 within that group to move to an open position in which no clamping force is applied and may increase the clamping force of the actuators of other groups. This redundancy allows the reactor system 5 to be shut-down only upon failure of an actuator 29 within each group of actuators.

Figure 9:
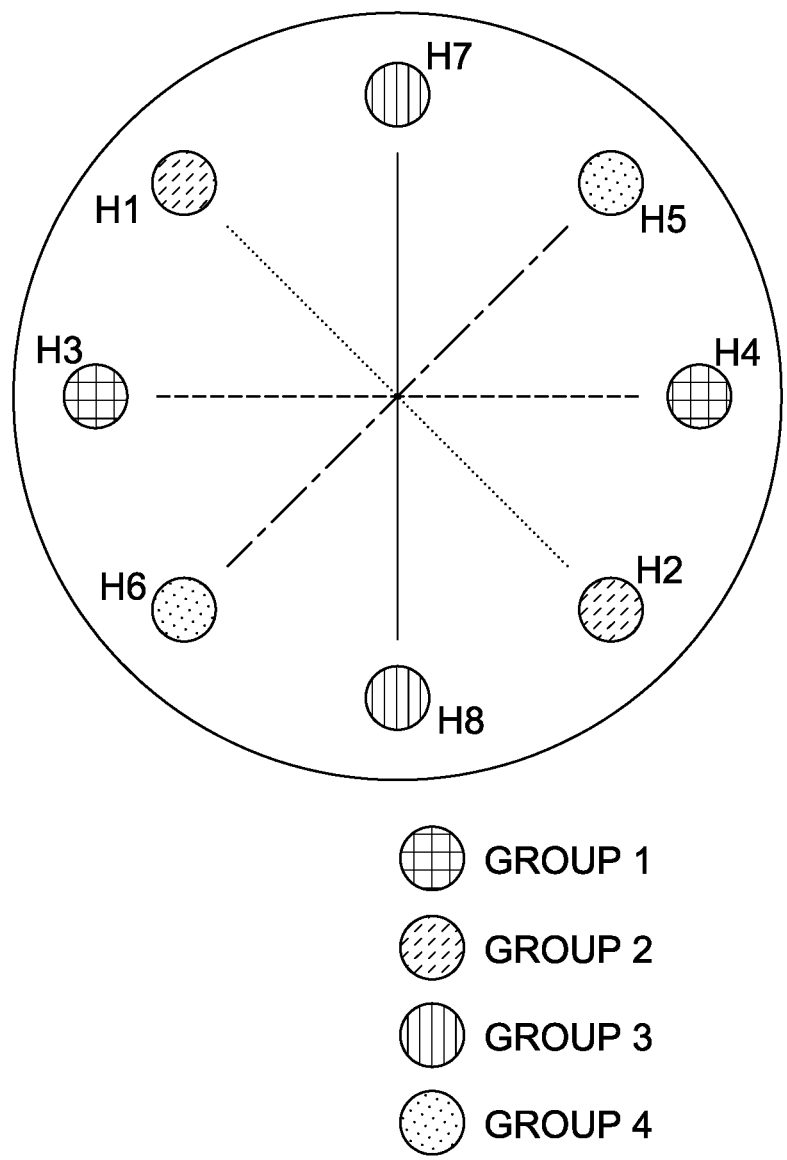
FIG. 9 is a schematic of an eight cylinder clamping system having four groups of cylinders independently controlled.
Figure 10:
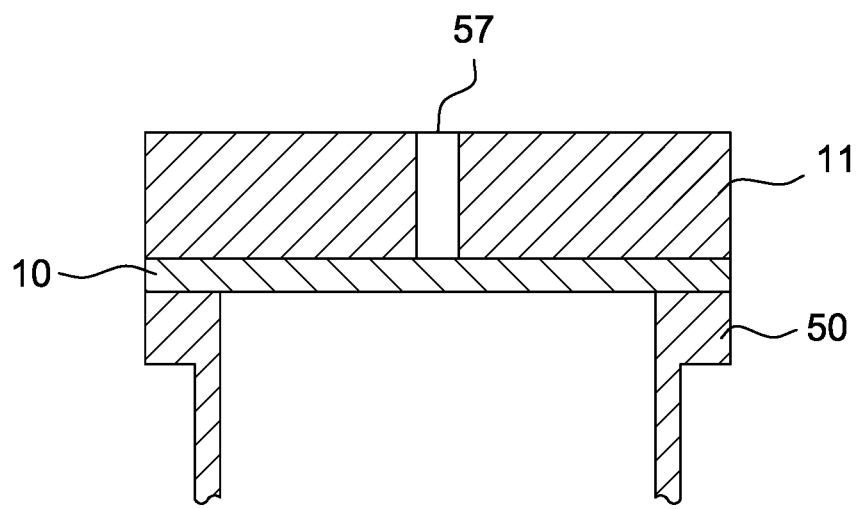
FIG. 10 is a partial cross-section view of the reactor system having a gasket disposed between the seal plate and a flange that extends from the outer shell.

Other arrangements may be used such as an eight cylinder arrangement (FIG. 9) in which four groups of two cylinders are independently controlled by use of separate control valves and/or hydraulic pumps.

Figure 3:
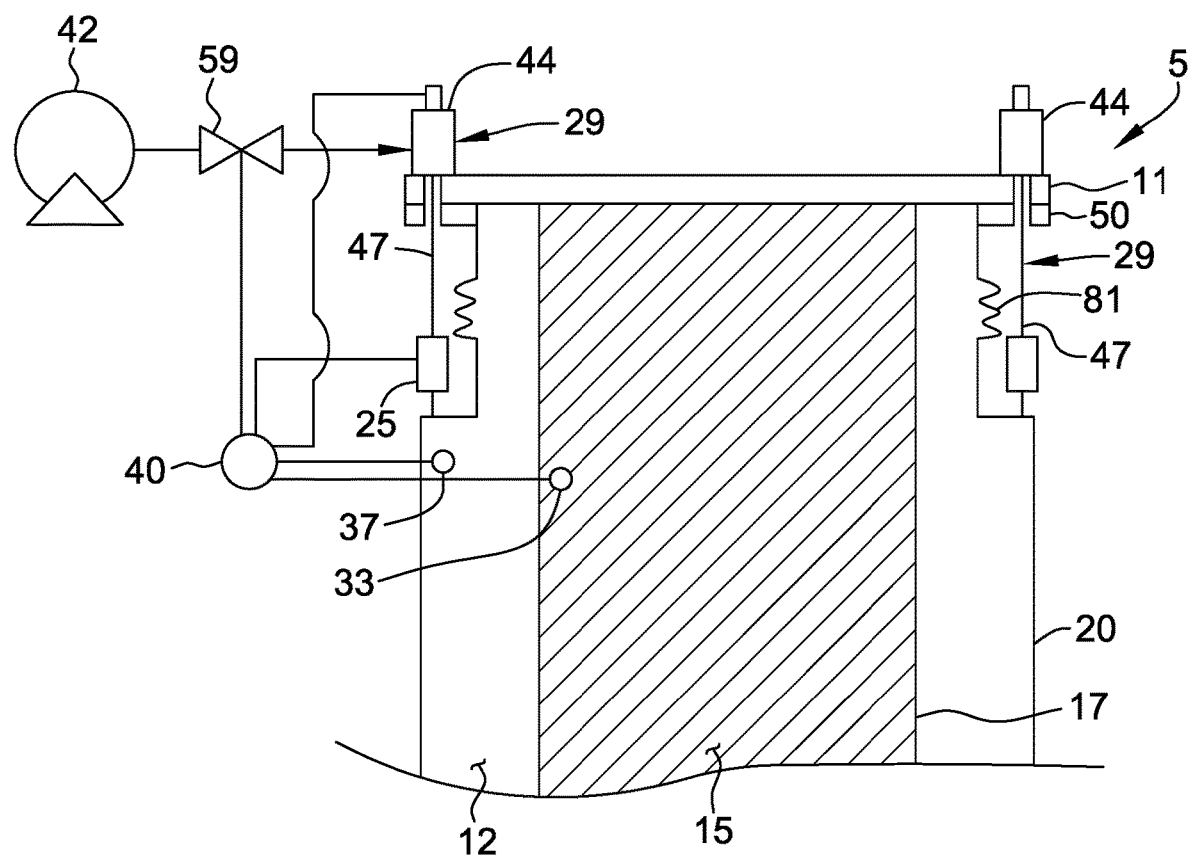
FIG. 3 is a schematic of a reactor system with a clamping assembly having hydraulic cylinders.

In the embodiment illustrated in FIG. 3, the rod 47 of the cylinder 29 extends through the seal plate 11 and through the flange 50 of the outer shell 20. The housing 44 is mounted across the seal plate 11 opposite the flange 50 (i.e., in a direction opposite the shell 20). In this arrangement, the hydraulic cylinder 29 clamps the seal plate 11 to the outer shell 20 by retracting the rod 47 (e.g., the hydraulic circuit is attached to the retract port of the cylinder 29 such that the chamber 55 (FIG. 4) is pressurized).

The closing force ($F_c$) for the reactor system of FIG. 3 may be determined as follows:

$$F_C = P_{12}*A_{12} + P_{15}*A_{15} + F_S - k*x - W \qquad (eq.\ 1)$$

wherein $P_{12}$ is the pressure inside the annular chamber 12, $A_{12}$ is the effective area of the annular chamber 12, $P_{15}$ is the pressure in the reaction chamber 15, $A_{15}$ is the effective area of the reaction chamber 15, $F_S$ is the sealing force required to seal the reaction chamber 15 from the annular chamber 12, k is the spring constant of the outer shell expansion joint 81, x is the axial extension or compression measured by the positioning sensor and W is the weight of the seal plate 11.

The controller 40 may compute the closing force using equation 1 based on input from the pressure sensors 33, 37 and the axial extension or compression of the expansion joint 81 measured by the positioning sensor 62. The controller 40 may set the pressure inside the cylinders 29 by valve 59 to set the system closing force, $F_C$. The sensor 25 provides feedback to the controller 40 relating to applied force. The controller 40 may adjust the applied force based on the feedback of the sensor 25.

The force $F_h$ exerted by each cylinder 29 may be calculated as $$F_h = P_{55}*A_{55} - P_{53}*A_{53} \qquad (eq.\ 2)$$

wherein $P_{53}$ and $P_{55}$ are the pressures of the chambers 53, 55 (FIG. 4) and $A_{53}$ and $A_{55}$ are the effective cross-section areas of the chambers 53, 55, respectively. The total force of the system is the number of cylinders (n) multiplied by $F_h$. The pressure inside the cylinders may be related to the closing force as follows:

$$n(P_{55}*A_{55} - P_{53}*A_{53}) = P_{12}*A_{12} + P_{15}*A_{15} + F_S - k*x - W \qquad (eq.\ 3)$$

In embodiments in which the chamber 53 is ambient ($P_{53}=0$), the pressure $P_{55}$ in the other chamber 55 is:

$$P_{55} = (P_{12}*A_{12} + P_{15}*A_{15} + F_S - k*x - W)/(n*A_{53}) \qquad (eq.\ 4)$$

The hydraulic pressure $P_{55}$ may be controlled by use of valve 59.

In embodiments in which the cylinders 29 are grouped for independent control, the hydraulic pressure of each cylinder may be determined according to equation 4. In instances in which a group of cylinders is taken off-line due to failure of a cylinder within the group, the number, n, of cylinders used in equation 4 is reduced to the number of operating cylinders.

Figure 5:
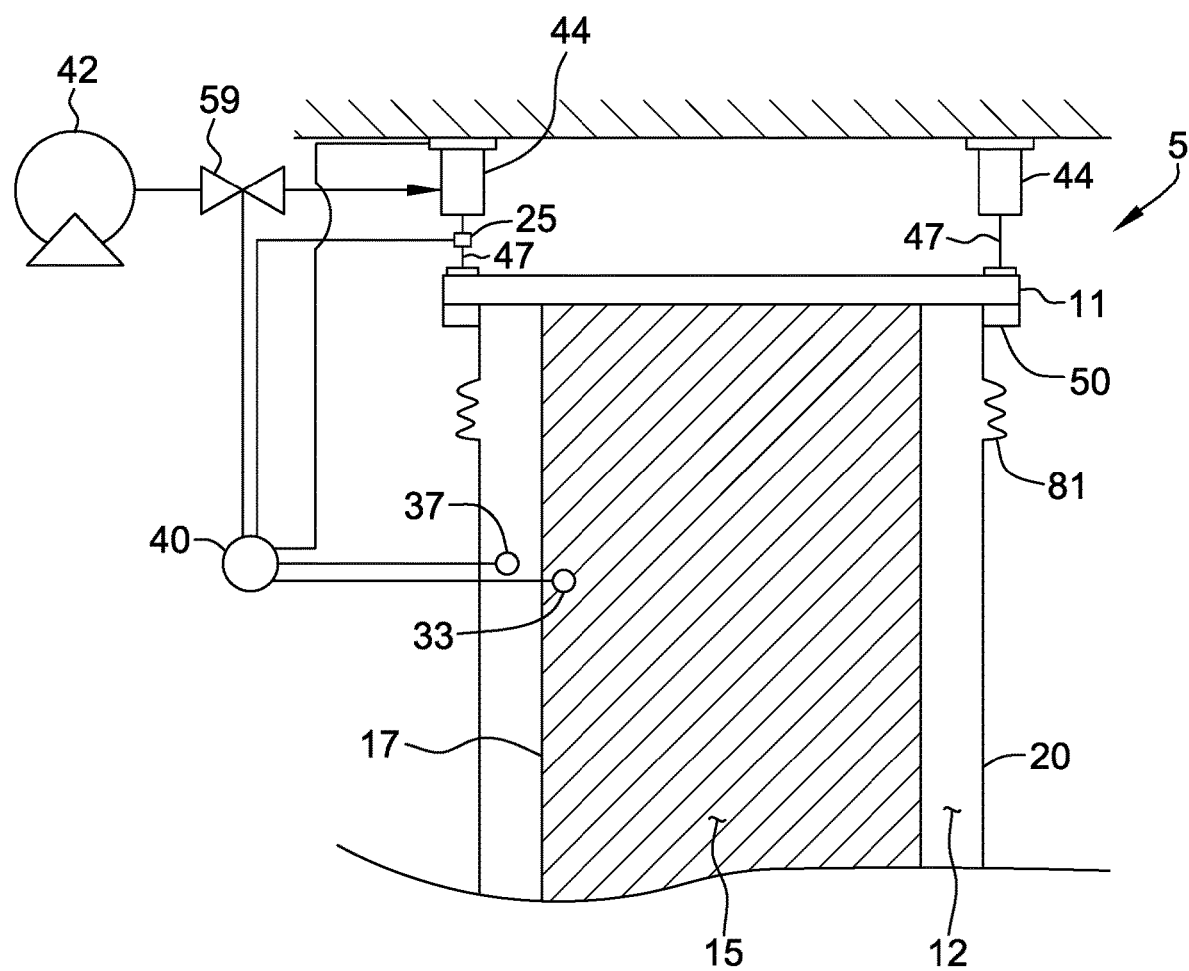
FIG. 5 is a schematic view of another embodiment of a clamping system having hydraulic cylinders.

In the embodiment of FIG. 5, the rod 47 is attached to the seal plate 11 and the housing 44 is mounted across the seal plate 11 opposite the outer shell 20. The housing 44 is attached to a fixed external component (e.g., the frame supporting the reactor system 5). In this arrangement, the hydraulic cylinder 29 clamps the seal plate 11 to the outer shell 20 by extending the rod 47 (e.g., the hydraulic circuit is attached to the extend port of the cylinder 29 such that the chamber 53 (FIG. 4) is pressurized). The hydraulic pressure may be calculated according to equation 4 with the opposite chamber being pressurized (i.e., use of $A_{55}$).

Figure 6:
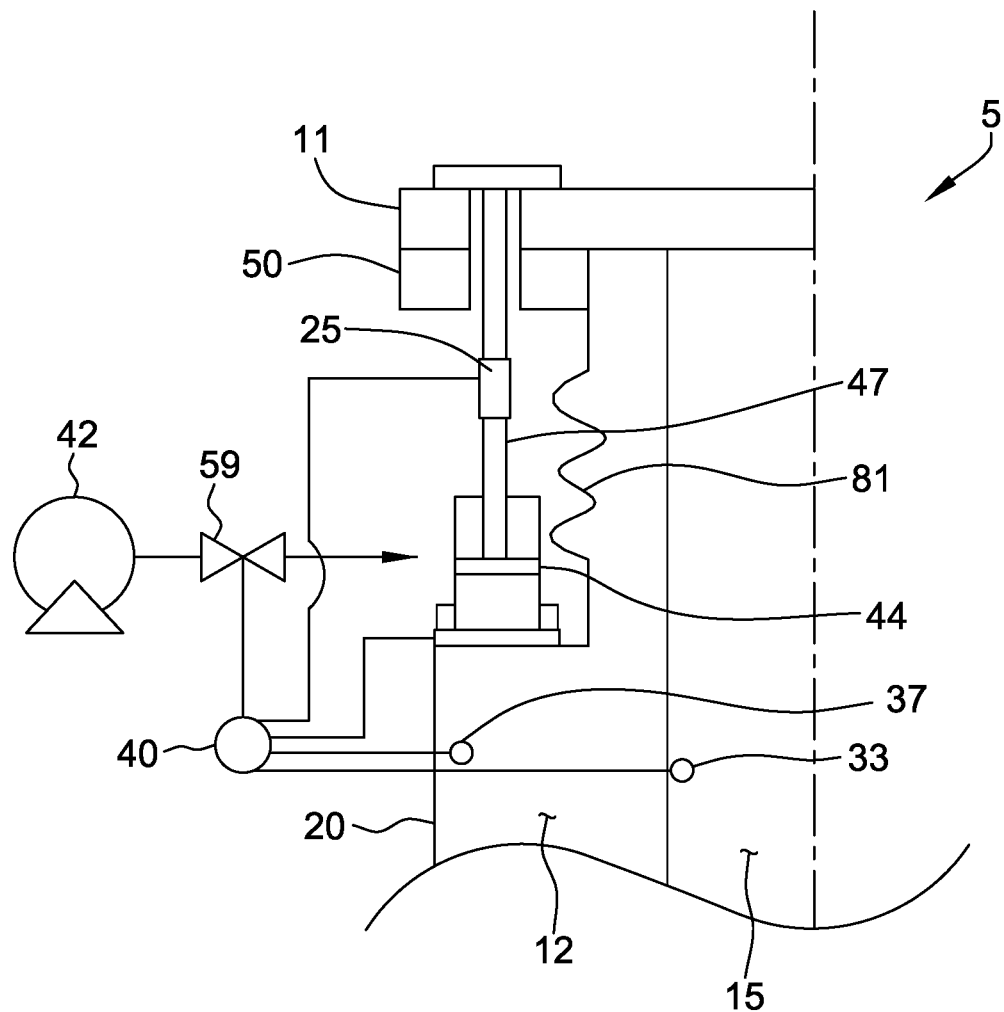
FIG. 6 is a schematic view of another embodiment of a clamping system having hydraulic cylinders.

Another embodiment of the reactor system 5 is shown in FIG. 6. The rod 47 of each cylinder 29 extends through the flange 50 of the outer shell 20 and extends through the seal plate 11. The rod 47 is attached to the seal plate 11. The housing 44 is attached to the outer shell 20 (e.g., clamping ring 31 (FIG. 1)).

Figure 7:
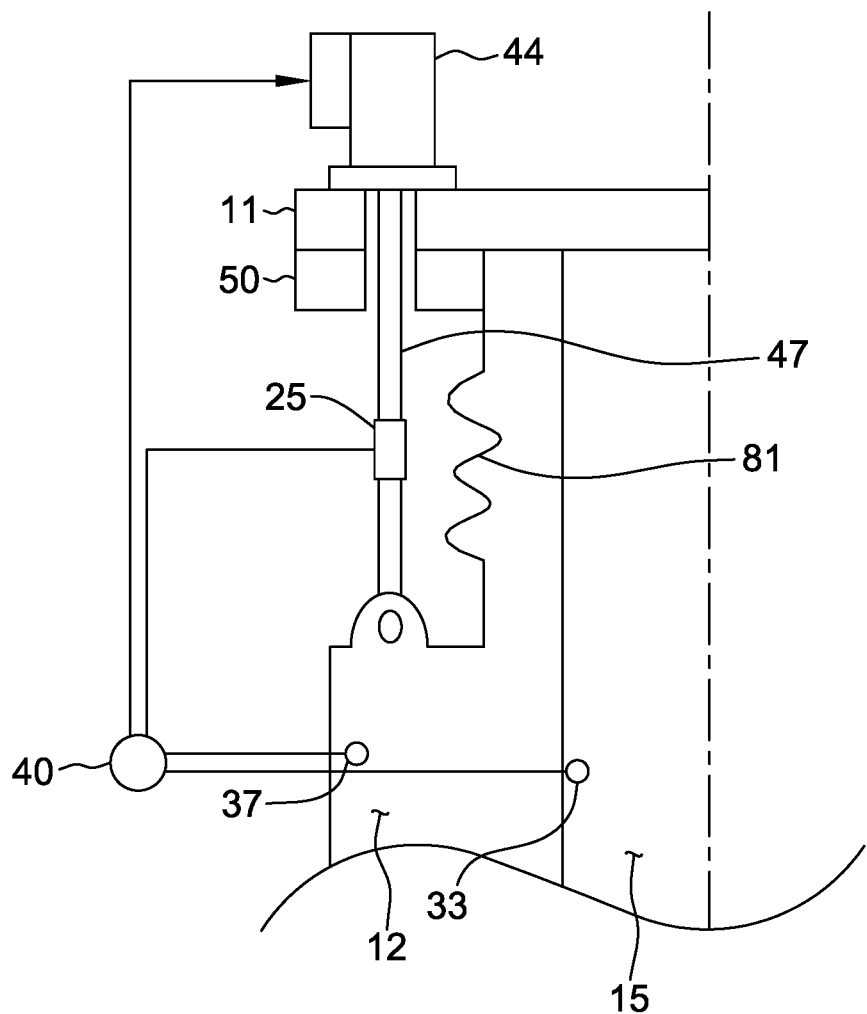
FIG. 7 is a schematic view of a reactor system with a clamping assembly having electric linear actuators.

While the actuators 29 have been generally described herein with reference to hydraulic cylinders, the embodiments and principles described herein generally apply to other types of actuators. As shown in FIG. 7, electric linear actuators 29 are used in the same mounting arrangement as shown in FIG. 3. In such embodiments, the force of the linear actuator $P_{LA}$ may be calculated as follows:

$$P_{LA}=(P_{12}*A_{12}+P_{15}*A_{15}+F_S-k*x-W)/n \quad \text{(eq. 5)}$$

The reactor system 5 may be operated by reacting reactor fluids in the reaction chamber 15 (FIG. 1). A second fluid may be present in the annular chamber 12 to prevent the reaction chamber 15 from being contaminated. The reaction fluid in the annular chamber 12 is generally inert to the reaction components within the reaction chamber 15. In some embodiments, the fluids in the reaction chamber 15 and annular chamber 12 are both gases. The reaction chamber 15 may be operated at a pressure greater than the annular chamber 12 such as at least about 0.1 bar greater or at least about 0.5 bar, at least about 1 bar or at least about 2 bar greater (e.g., from about 0.1 bar to about 5 bar, from about 0.1 bar to about 2 bar or from about 0.1 bar to about 0.9 bar greater). The annular chamber 12 may include a heater 13 therein to heat the reactor components in the reaction chamber 15.

In some embodiments, the reactor system 5 is used to produce polycrystalline silicon. A silicon feed gas comprising a silicon-containing compound is introduced into the reaction chamber 15. Silicon particles (e.g., seed particles) are fluidized in the reaction chamber 15 by the incoming gases. Silicon deposits on the particles by the thermal decomposition of the silicon-containing compound. When the particulate has grown to sufficient size, particulate is withdrawn from the reaction chamber 15 through a product withdrawal tube (not shown). Exhaust gases are withdrawn from the gas withdrawal tube 57. In some embodiments, the reaction chamber 15 is operated at relatively high pressure such as at least about 2 bar or, as in other embodiments, the reaction chamber is controlled to be at least about 3 bar, at least about 4 bar, at least about 5 bar, at least about 10 bar, at least about 15 bar, at least about 20 bar or even about 25 bar or more (e.g., from about 3 bar to about 25 bar or from about 4 bar to about 20 bar).

In embodiments in which silane is used as the thermally decomposable compound, the reactor may be operated in accordance with the reaction conditions disclosed in U.S. Patent Publication No. 2013/0084233, which is incorporated herein by reference for all relevant and consistent purposes. In embodiments in which dichlorosilane is used as the thermally decomposable compound, the reactor may be operated in accordance with the reaction conditions disclosed in U.S. Patent Publication No. 2012/0164323, which is incorporated herein by reference for all relevant and consistent purposes. In embodiments in which trichlorosilane is used as the thermally decomposable compound, the reactor may be operated in accordance with the reaction conditions disclosed in U.S. Patent Publication No. 2012/0100059, which is incorporated herein by reference for all relevant and consistent purposes.

Compared to conventional reactor systems, embodiments of the reactor system 5 described above have several advantages. In embodiments in which the actuators are arranged in two or more groups of actuators with actuators within each group being arranged symmetrically, the system may remain sealed upon failure of one or more cylinders within a group due to redundancy between groups thereby increasing reactor system runtime. Pressure sensors in the reaction chamber and/or annular chamber and actuator force sensors allow for precise control of the clamping force applied by the actuators. The systems can also reduce or increase clamping force based on changes in the reaction chamber and/or annular chamber pressures.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiments thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawings shall be interpreted as illustrative and not in a limiting sense.

What is claimed is:

1. A reactor system for producing a reaction product comprising:
   a reactor liner defining a reaction chamber therein for receiving reaction components, the reactor liner having an upper end;
   an outer shell around the reactor liner, an annular chamber formed between the reactor liner and outer shell, the outer shell having an upper end;

a seal plate that seals the annular chamber and that seals the reaction chamber, the seal plate being disposed above the entire reactor liner and being disposed above the entire outer shell; and a plurality of actuators configured to clamp the seal plate directly to the upper end of the outer shell and to simultaneously clamp the seal plate directly to the upper end of the reactor liner to seal the annular chamber from the reaction chamber.

2. The reactor system as set forth in claim 1 wherein the plurality of actuators are attached to the outer shell and the seal plate.

3. The reactor system as set forth in claim 1 wherein the seal plate is a disk having a circumference, the plurality of actuators being equally spaced around the circumference of the seal plate so that the clamping force is symmetric.

4. The reactor system as set forth in claim 1 wherein the plurality of actuators are arranged in two or more groups of actuators, each group having a control valve and/or pump connected to the actuators of the group for independent control of each group, the actuators of each group being equally spaced around the circumference of the seal plate so that the clamping force is symmetric.

5. The reactor system as set forth in claim 1 further comprising a gasket disposed between the seal plate and a flange that extends from the outer shell.

6. The reactor system as set forth in claim 1 wherein each actuator is a powered cylinder.

7. The reactor system as set forth in claim 6 wherein the powered cylinder includes a housing and a rod that extends from the housing, the rod extending through the seal plate and being attached to the outer shell, the housing being mounted across the seal plate opposite the outer shell.

8. The reactor system as set forth in claim 6 wherein the powered cylinder includes a housing and a rod that extends from the housing, the rod being attached to the seal plate, the housing being mounted across the seal plate opposite the outer shell.

9. The reactor system as set forth in claim 6 wherein the powered cylinder includes a housing and a rod that extends from the housing, the rod extending through the seal plate and being attached to the seal plate, the housing being mounted to the outer shell.

10. The reactor system as set forth in claim 1 comprising sensors to measure the force applied by each actuator.

11. The reactor system as set forth in claim 10 wherein the sensors are load cells.

12. The reactor system as set forth in claim 10 wherein the actuators are cylinders including pressurized fluid therein, the sensors measuring the pressure of the fluid to determine the force applied by the actuator.

13. The reactor system as set forth in claim 1 wherein the reactor system is a fluidized bed reactor for thermally decomposing a silicon-containing gas to deposit silicon on silicon particles.

14. The reactor system as set forth in claim 13 in combination with a thermally decomposable silicon-containing inlet gas.

15. The reactor system as set forth in claim 1 further comprising a heater in the annular chamber.

16. A reactor system for producing a reaction product comprising:

a reactor liner defining a reaction chamber therein for receiving reaction components, the reactor liner having an upper end;

an outer shell around the reactor liner, the outer shell having an upper end, an annular chamber formed between the reactor liner and the outer shell;

a seal plate that seals the annular chamber and that seals the reaction chamber, the seal plate forming an upper wall of the reaction chamber and an upper wall of the annular chamber;

an actuator configured to clamp the seal plate directly to the upper end of the outer shell and to simultaneously clamp the seal plate directly to the upper end of the reactor liner to seal the annular chamber from the reaction chamber; and a sensor for measuring a clamping force applied by the actuator.

17. The reactor system as set forth in claim 16 wherein the sensor is a load cell.

18. The reactor system as set forth in claim 16 wherein the actuator is a cylinder including pressurized fluid therein, the sensor measuring the pressure of the fluid to determine the clamping force applied by the actuator.

19. The reactor system as set forth in claim 16 comprising a clamping ring extending from the outer shell, the seal plate being attached to the clamping ring to seal the annular chamber and the reaction chamber.

20. The reactor system as set forth in claim 16 further comprising a pressure sensor for sensing the pressure in the reaction chamber.

21. The reactor system as set forth in claim 16 further comprising:

a first pressure sensor for sensing the pressure in the reaction chamber; and a second pressure sensor for sensing the pressure in the annular chamber.

22. The reactor system as set forth in claim 16 further comprising a controller for adjusting the force applied by the actuator.

23. The reactor system as set forth in claim 16 wherein the actuator is a powered cylinder.

24. The reactor system as set forth in claim 23 wherein the powered cylinder includes a housing and a rod that extends from the housing, the rod extending through the seal plate and being attached to the outer shell, the housing being mounted across the seal plate opposite the outer shell.

25. The reactor system as set forth in claim 23 wherein the powered cylinder includes a housing and a rod that extends from the housing, the rod being attached to the seal plate, the housing being mounted across the seal plate opposite the outer shell.

26. The reactor system as set forth in claim 23 wherein the powered cylinder includes a housing and a rod that extends from the housing, the rod extending through the seal plate and being attached to the seal plate, the housing being mounted to the outer shell.

27. The reactor system as set forth in claim 16 further comprising a heater in the annular chamber.

28. The reactor system as set forth in claim 16 comprising a positioning sensor for measuring movement of the seal plate resulting from expansion or contraction in the reactor system.

29. The reactor system as set forth in claim 1 wherein the seal plate forms a wall of the reaction chamber.

30. The reactor system as set forth in claim 1 wherein the reaction chamber extends to the seal plate.

31. The reactor system as set forth in claim 16 wherein the reactor liner has an upper end, the seal plate being disposed above the reactor liner, the actuator clamping the seal plate to the upper end of the reactor liner to seal the annular chamber from the reaction chamber.

32. A reactor system for producing a reaction product comprising:
- a reactor liner defining a reaction chamber therein for receiving reaction components, the reactor liner having an upper end;
- an outer shell around the reactor liner, the outer shell having an upper end, an annular chamber formed between the reactor liner and outer shell;
- a seal plate that seals the annular chamber and that seals the reaction chamber, the seal plate forming a wall of the reaction chamber and an upper wall of the annular chamber; and
- a plurality of powered cylinders configured to clamp the seal plate directly to the upper end of the outer shell and to simultaneously clamp the seal plate directly to the upper end of the reactor liner to seal the annular chamber from the reaction chamber, the powered cylinders varying a clamping force based on a signal transmitted by a controller.

33. The reactor system as set forth in claim 16 wherein the seal plate is generally planar.

\* \* \* \* \*